(12) United States Patent
Shi et al.

(10) Patent No.: US 8,080,284 B2  
(45) Date of Patent: Dec. 20, 2011

(54) METHOD FOR MANUFACTURING A HOUSING

(75) Inventors: Zheng Shi, Shenzhen (CN); Chih-Chiang Chang, Taipei Hsien (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 473 days.

(21) Appl. No.: 12/339,258

(22) Filed: Dec. 19, 2008

(65) Prior Publication Data

US 2009/0246381 A1  Oct. 1, 2009

(30) Foreign Application Priority Data

Mar. 25, 2008 (CN) .......................... 2008 1 0300707

(51) Int. Cl.
*B05D 1/32* (2006.01)
*B05D 1/38* (2006.01)

(52) U.S. Cl. ......... 427/259; 427/265; 427/282; 427/585

(58) Field of Classification Search .................. 427/259, 427/265, 282, 585
See application file for complete search history.

(56) References Cited

U.S. PATENT DOCUMENTS

| | | | |
|---|---|---|---|
| 6,200,630 B1 * | 3/2001 | Eriksson | 427/123 |
| 2003/0203219 A1 * | 10/2003 | Lin et al. | 428/457 |
| 2004/0239836 A1 * | 12/2004 | Chase | 349/98 |

FOREIGN PATENT DOCUMENTS

| | | |
|---|---|---|
| CN | 1161457 A | 10/1997 |
| CN | 1303900 A | 7/2001 |
| CN | 1453142 A | 11/2003 |
| CN | 101005738 A | 7/2007 |

* cited by examiner

*Primary Examiner* — Frederick Parker
(74) *Attorney, Agent, or Firm* — Altis Law Group, Inc.

(57) ABSTRACT

A method for manufacturing a housing (100) out of a transparent housing including an inner surface (10) and an outer surface (20), is described. Ink is printed on the inner surface (10) to form a ink area (50) defining a window area (40). The window area (40) and the ink area (50) are shielded and a painting process carried out on non-shielded portions of the inner surface (10). Finally, non-conductive vacuum metallization is carried out on the outer surface (20) to form the manufactured housing (100).

9 Claims, 4 Drawing Sheets

METHOD FOR MANUFACTURING A HOUSING

BACKGROUND

1. Field of the Invention

The present invention relates to a method for manufacturing a housing, and especially relates to a method for manufacturing a housing of an electronic device.

2. Description of Related Art

With the rapid growth of information technology, portable electronic devices, such as mobile phones, personal digital assistants (PDAs) and notebook computers are widely used. The appearance quality and aesthetic measure of the housing of the electronic device are getting more and more attention. For improving the electronic product's appearance and achieve multiple colors on the electronic product's housing, a painting method is usually adopted for coating a paint layer on a surface of the electronic product's housing. However, the painting layer of housing surface is not always anti-corrosive. In such case, the surface of the housing may become corroded and have degraded quality. Additionally, without proper shielding, paint may accidentally spread to edges of the housing.

If the housing of the electronic device is made of metal material instead of plastic material, costs increase. Furthermore, the antenna of the electronic devices may subject to interference by metal materials.

Therefore, there is room for improvement within the art.

BRIEF DESCRIPTION OF THE DRAWINGS

Many aspects of the present method for manufacturing a housing can be better understood with reference to the following drawings. The components in the drawings are not necessarily drawn to scale, the emphasis instead being placed upon clearly illustrating the principles of the present method for manufacturing a housing. Moreover, in the drawings, like reference numerals designate corresponding parts throughout the several views, in which.

DETAILED DESCRIPTION OF THE EXEMPLARY EMBODIMENTS

Figure 1:
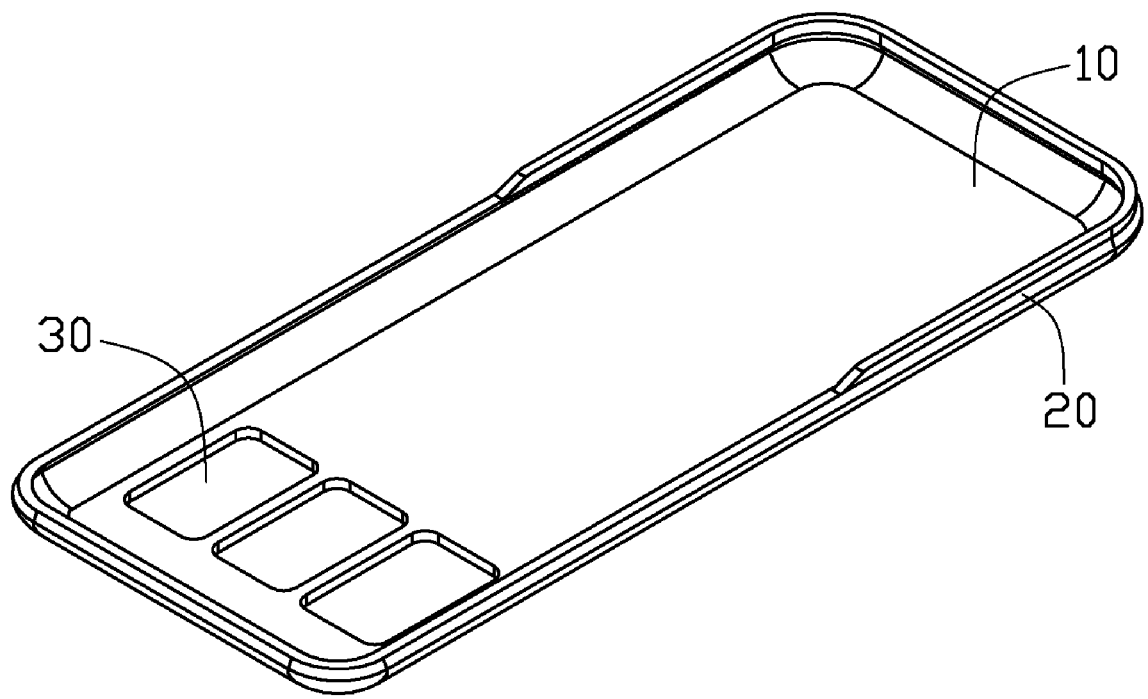
FIG. 1 shows an exploded, schematic view of an exemplary embodiment of the present pre-manufactured housing.

In an exemplary embodiment, the method for manufacturing a housing is to be described relative to an exemplary cell phone housing. The method includes at least the following steps:

Referring to FIG. 1, a transparent pre-manufactured cell phone housing 100 has an inner surface 10 and an outer surface 20 opposite to the inner surface 10. A keypad area of the housing 100 defines one or more openings 30. In the exemplary embodiment, the housing 100 may be made by injection molding. For example, a molten transparent plastic material, such as polymethylmethacrylate (PMMA) is injected into a mold cavity of an injection molding machine. The transparent plastic material is cooled, the mold opened, and the transparent pre-manufactured housing 100 removed from the injection molding machine.

Figure 2:
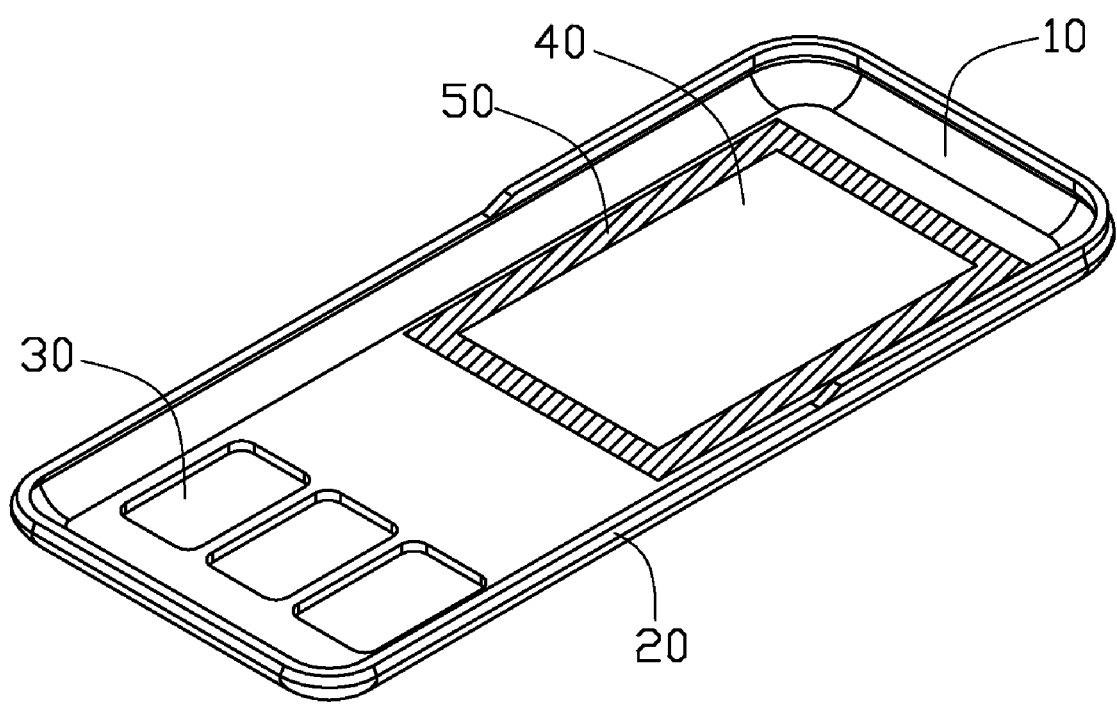
FIG. 2 shows a schematic view of the housing after a process of transfer printing.

Referring to FIG. 2, the inner surface 10 of the housing 100 is printed with ink to define a transparent window area 40. In the exemplary embodiment, a transfer printing technology is adopted. For example, a transfer printing machine including a rubber head and a steel mould is provided. The rubber head is positioned on a bottom of a pressure printing bar. The steel mould defines a rectangular frame, and the rectangular frame is filled with ink. The rubber head presses on the steel mould for making a rectangular frame ink area 50 of the steel mould absorbed on the rubber head. The pressure printing bar uplifts the rubber head and moves to the upward side of the inner surface 10 of the housing 100. Lastly, the rubber head is pressed downward for making the ink area 50 transfer print on the inner surface 10, to define the transparent window area 40.

Figure 3:
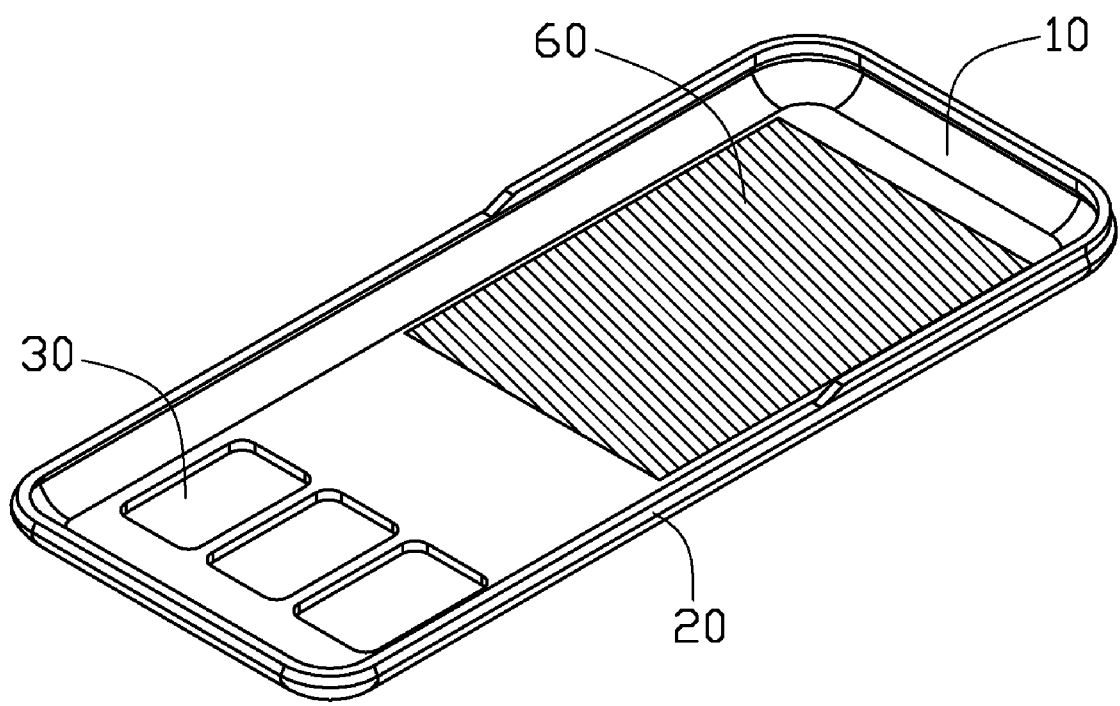
FIG. 3 shows a schematic view of a window of the housing shielding a gum paper.
Figure 4:
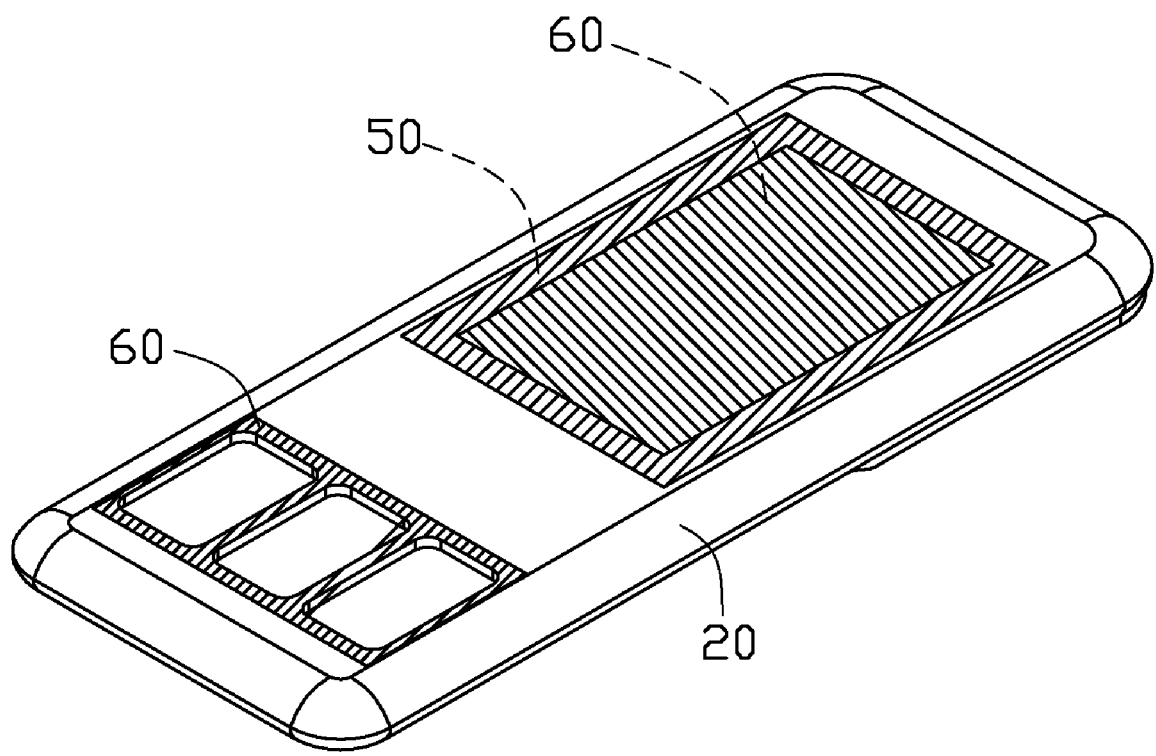
FIG. 4 shows a schematic view of an opening of the housing shielding a gum paper.

Referring to FIGS. 3-4, the transparent window area 40 and the ink area 50 are shielded by gum paper 60. Additionally, edge of the one or more openings 30 are shielded.

The housing 100 is then fixed on an upload fixture with the inner surface 10 facing a paint spray gun. The paint spray gun sprays paint to make a paint layer on the inner surface 10. The gum paper 60 shields the ink area 50 and the edge of the opening 30 to avoid over painting inside the transparent window area 40. Additionally, the edge of the opening 30 is shield by the gum paper 60. Therefore, even the paint overflow on the outer surface 20, the gum paper 60 can prevent the outer surface 20 from being painted.

The housing 100 is removed from the upload fixture, and the gum paper 60 removed. Finally, the non-conductive vacuum metallization (NCVM) processing is adopted on the outer surface 20 to form a non-metal deposition film.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing a housing, comprising steps of:
   providing a transparent housing including an inner surface and an outer surface;
   printing ink on the inner surface to form an ink area defining a window area surrounded by the ink area;
   shielding the window area and the ink area;
   painting non-shielded portions of the inner surface;
   conducting non-conductive vacuum metallization on the outer surface to form the housing.

2. The method for manufacturing a housing as claimed in claim 1, wherein the step of printing ink on the ink area of the inner surface uses transfer print technology.

3. The method for manufacturing a housing as claimed in claim 2, wherein the step of shielding the window area uses gum paper.

4. The method for manufacturing a housing as claimed in claim 3, wherein the housing defines at least one opening, and the step of shielding further comprises shielding an edge of the opening using gum paper before the painting step.

5. The method for manufacturing a housing as claimed in claim 1, wherein the step of providing a transparent housing further comprises forming the housing from polymethylmethacrylate.

6. A method for manufacturing a housing, comprising steps of:
- providing a transparent housing including an inner surface and an outer surface, the housing defining at least one opening communicating with the inner surface and the outer surface;
- printing ink on the inner surface to form an ink area defining a window area surrounded by the ink area;
- shielding the window area and the ink area on the inner surface by gum paper;
- shielding edges of the at least one opening on the outer surface by gum paper to prevent the outer surface from being painted;
- painting non-shielded portions of the inner surface;
- conducting non-conductive vacuum metallization on the outer surface to form the housing.

7. The method for manufacturing a housing as claimed in claim 6, wherein the step of printing ink on the ink area of the inner surface uses transfer print technology.

8. The method for manufacturing a housing as claimed in claim 7, wherein the method for manufacturing a housing further comprises: providing a transfer printing machine including a rubber head, absorbing ink on the rubber head, pressing downward the rubber head to make the ink area transfer print on the inner surface and to define the window area.

9. The method for manufacturing a housing as claimed in claim 6, wherein the step of providing a transparent housing further comprises forming the housing from polymethylmethacrylate.

* * * * *